United States Patent [19]

Abt et al.

[11] 4,336,615
[45] Jun. 22, 1982

[54] LINEAR LOADING FOR PWM FILTER

[75] Inventors: Richard F. Abt; William L. Behrend, both of Pittsburgh, Pa.

[73] Assignee: RCA Corporation, New York, N.Y.

[21] Appl. No.: 193,023

[22] Filed: Oct. 2, 1980

[51] Int. Cl.³ .................... H03G 11/04; H03C 1/06
[52] U.S. Cl. ................................ 455/108; 375/22; 332/59; 330/11; 330/207 A
[58] Field of Search .................. 375/22, 60; 307/265, 307/268, 260; 332/9 R, 59; 330/10, 11, 207 A, 146; 455/127, 108

[56] References Cited

U.S. PATENT DOCUMENTS

| | | | |
|---|---|---|---|
| 3,335,370 | 8/1967 | Wittig et al. | 455/108 |
| 3,413,570 | 11/1968 | Bruene et al. | 455/108 |
| 4,178,556 | 12/1979 | Attwood | 330/10 |

Primary Examiner—Benedict V. Safourek
Assistant Examiner—Stephen Chin
Attorney, Agent, or Firm—P. J. Rasmussen; William H. Meise; Henry I. Steckler

[57] ABSTRACT

An AM broadcast transmitter uses a PWM modulator that requires a pulse width filter. It has been found that the filter load varies over the modulation cycle resulting in distortion. To overcome this problem, a varying voltage is applied to an RF driver stage during portions of the modulation cycle.

8 Claims, 4 Drawing Figures

LINEAR LOADING FOR PWM FILTER

BACKGROUND OF THE INVENTION

The present invention relates to AM broadcast transmitters, and more particularly those that use a pulse width modulation (PWM) modulator to supply voltage to a solid state final amplifier and a driver stage therefor.

The AM transmitter of the present invention has an internally generated subcarrier that is pulse-width modulated by a DC and an audio signal. The width-modulated pulses are amplified by a switching type amplifier. A low-pass filter (pulse-width-filter, PWF) following the amplifier removes the subcarrier and its sideband components and provides amplified DC and audio voltages at its output that are applied to the final power amplifier (PA) and a driver stage. The DC modulation sets the duty factor of the square wave subcarrier to provide a selected DC voltage required for a given RF carrier power, and the audio modulation of the pulse width of the subcarrier provides the magnitude of the audio voltage required for a given percentage AM modulation of said carrier. To obtain a maximally flat audio frequency response, the load presented to the output of the PWF must be a resistance of correct magnitude and be constant with the frequency, and for minimum total harmonic distortion (THD), this load impedance must be linear, i.e., constant, throughout the audio cycle from 100% negative modulation to 100% positive modulation. However, it has been found that as the voltage applied to the PA varies from the carrier DC level to 100% negative modulation, the filter load impedance decreases. This is caused by a number of factors such as: (a) the output capacitance of the PA transistors increases with decreasing collector-emitter voltage, resulting in a lower cut-off frequency ($f_t$) characteristic, thereby slowing the turn-off of the devices and resulting in higher shoot-through current (this is a very large current spike when momentarily all transistors in the PA bridge are conducting because of overlapping turn-on and turn-off times), and (b) an RF drive transformer for the PA becomes less efficient because the modulated drive from the driver stage does not provide enough magnetizing current in the ferrite core of the transformer. This results in lower RF drive at the trough of modulation. In either case, distortion results, as explained above. It is therefore desirable to maintain a linear load at the output of the PWF.

SUMMARY OF THE INVENTION

An apparatus comprising an RF driver stage, and RF power amplifier stage coupled to said driver stage, a pulse width modulator having input means for receiving a modulating signal, a pulse-width filter having an input coupled to said modulator and an output coupled to said stages, and linearity correction means coupled between said output and said driver for increasing a DC supply voltage applied to said driver stage in accordance with the modulation voltage applied to said stages during that portion of the conduction cycle of the modulation signal where a non-linearity occurs.

DETAILED DESCRIPTION

Figure 1:
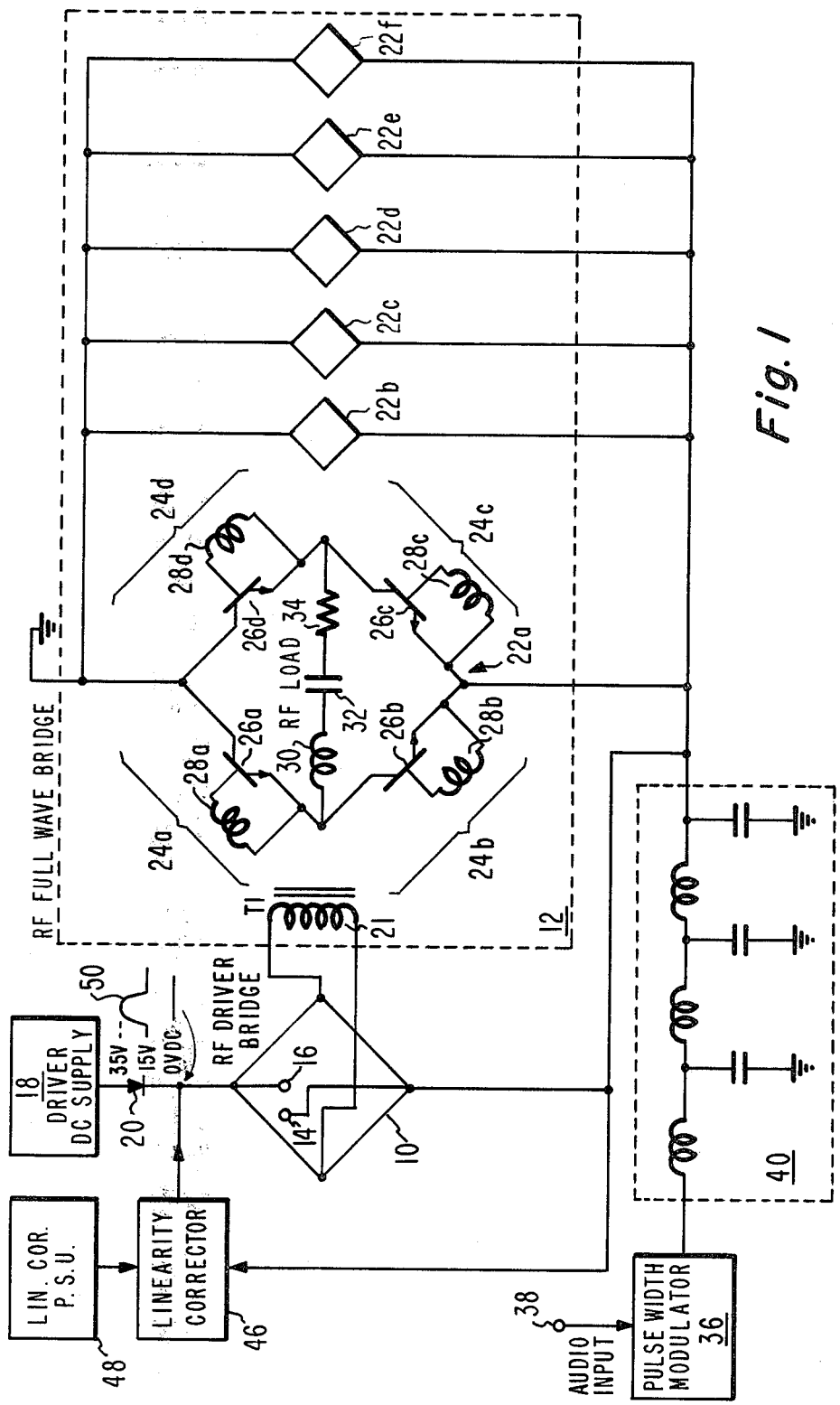
FIG. 1 is a diagram, partially in block and partially in schematic form showing an embodiment of the invention.

As shown in FIG. 1, an RF driver bridge 10 drives an RF PA (power amplifier) bridge 12. Driver bridge 10 receives RF drive at input terminals 14 and 16 from an RF pre-driver (not shown). Driver 10 comprises at least four transistors (not shown) arranged one in each leg of a full wave bridge configuration and amplifies the drive signal present at terminals 14 and 16. The amplified signal is applied to the primary 21 of ferrite core drive transformer T1 of PA 12.

Amplifier 12 comprises six identical class-D parallel connected bridges 22a, 22b, 22c, 22d, 22e, and 22f, one of which, 22a, is shown in detail. Bridge 22a comprises four identical arms 24a, 24b, 24c and 24d. Each arm comprises seven paralleled transistors, only one of which 26a, 26b, 26c and 26d is shown for each arm. Drive from transformer T1 is applied between the respective base-emitter junctions through secondaries of transformer T1, namely 28a, 28b, 28c and 28d, respectively. The RF load is coupled across diagonally opposed points of bridge 22a and comprises a series circuit of inductor 30, capacitor 32, and resistor 34, which resistor 34 is not a separate component, but represents the feedpoint resistance of an antenna as transformed by a harmonic filter (not shown) and a transformer (not shown) for combining the RF output power from all six bridges 22a, 22b, 22c, 22d, 22e and 22f.

Figure 2:
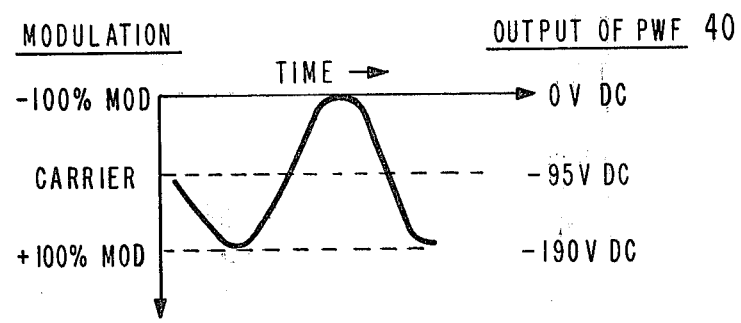
FIG. 2 is a graph of percent of modulation versus modulation voltage.

In order to supply both DC and modulation to both PA 12 and driver 10, a pulse width modulator 36 having an audio input 38 for receiving a modulating signal is provided. Modulator 36 supplied a 71.43 KHz subcarrier pulse signal to subcarrier or pulse width filter (PWF) 40, wherein the pulse width varies in accordance with the amplitude of the modulating signal. PWF 40 is a low-pass filter that has a cutoff frequency that is low enough to provide at its output a signal without the subcarrier or the sidebands thereof. Modulation is applied to driver 10 since otherwise a large DC voltage would be needed across driver 10 throughout the modulation cycle to handle the positive modulation peaks, which would cause excessive power dissipation by stage 10 and apply excessive drive to PA 12. Because of losses in the ferrite core of T1 and the base resistance of transistors 28, power supply 18 is used to provide extra DC power to driver 10 through diode 20 than that power available from PWF 40. In particular, it supplies a potential of about +15 to +18 volts. Hence, extra RF drive is applied to PA 12 to overcome said losses particularly at high positive modulation. As shown in FIG. 2, when the modulating signal has zero amplitude, the output voltage from PWF 40 is just the average value of the pulses from modulator 36, which in a particular embodiment is −95 volts. This is a DC voltage at which the transmitter supplies unmodulated carrier. When the modulation voltage increases to a selected maximum, the output voltage from PWF 40 is zero volts DC, which corresponds to −100% modulation. If the modulating voltage decreases to a selected minimum, the output voltage is −190 volts DC, which corresponds to +100% modulation. The output voltage is applied not only to PA 12, but also to driver 10.

Figure 3:
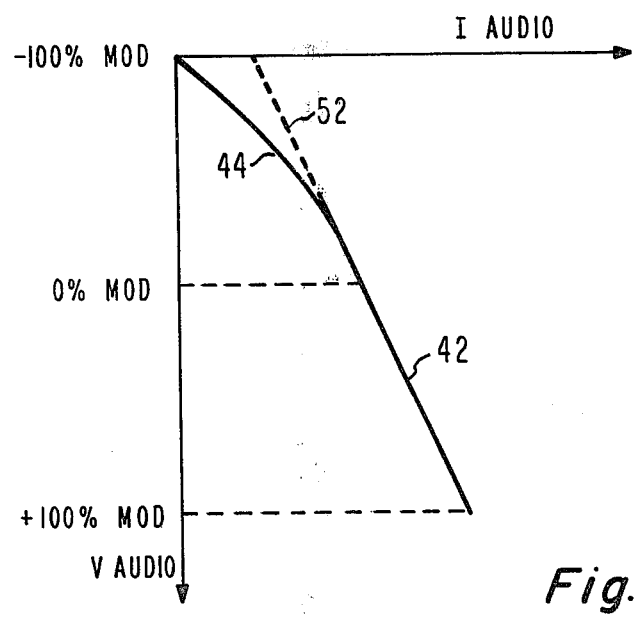
FIG. 3 is a graph of power amplifier audio voltage versus audio current.

FIG. 3 shows a graph of solid line portions 42 and 44 of PA 12 audio current drawn versus PWF 40 audio output voltage. It will be readily seen that the load resistance of PA 12 presented to filter 40 varies over different portions of the modulation cycle. The audio load resistance on the filter 40 for low modulation levels (about the DC voltage output of filter 40) is the slope of solid line 42. As the filter 40 audio output voltage increases (modulation level increases) the audio resistance does not remain constant because the slope does not remain at that of the slope line 42, but departs as shown by solid line 44 during the more positive audio voltages (negative modulation). In a particular embodiment, the slope is less between −70% and −100% modulation portions (line 44) than during the remaining portion (line 42). This causes the distortion problem described above.

To increase the load resistance on PWF 40 during the portion of the modulation cycle when the load resistance is low, more RF drive from driver 10 to PA 12 is necessary. This is accomplished by modulating, i.e., increasing the positive supply voltage by using a fractional sinewave pulse which is applied to driver 10 during that portion of the modulation cycle when the load resistance decreases by using linearity corrector 46 and linearity corrector power supply unit 48. Corrector 46 receives the output voltage of PWF 40 and increases the voltage applied to driver 10 to a peak value of about +35 volts during the appropriate portion of the modulation cycle, as is shown by waveform 50 drawn in FIG. 1. The result is that dotted line 52 of FIG. 3, together with line 42, represent the PWF 40 load. It will be noted that lines 42 and 52 together represent a constant load to filter 40.

Figure 4:
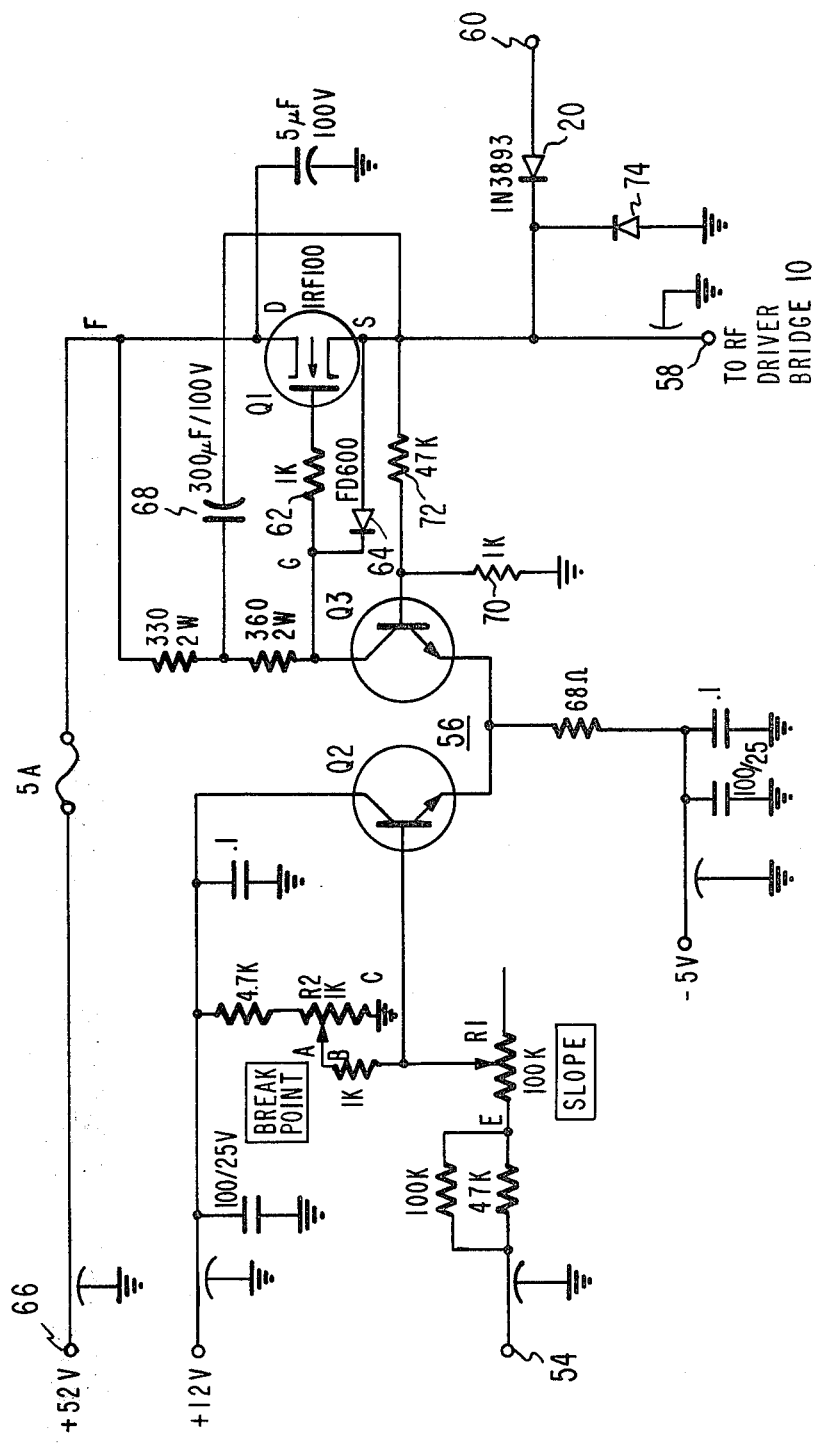
FIG. 4 is a circuit diagram of a linearity correction circuit.

FIG. 4 is a circuit diagram of linearity corrector 46. Input terminal 54 is coupled to the output of PWF 40. Rheostat R1 determines the magnitude of the correction voltage by controlling the amount of signal applied to the input of a differential amplifier 56 comprising transistors Q2 and Q3, the differential amplifier input being the base of Q2. Potentiometer R2 determines the breakpoint, i.e., the point in the modulation cycle at which the correction voltage is active, by varying the bias at the base of transistor Q2. The output signal from differential amplifier 56 is derived from the collector of transistor Q3 and applied to the gate of FET Q1 connected as a source follower. Resistor 62, together with the gate input capacitance, acts as a low pass filter to prevent oscillation by Q1, while diode 64 provides reverse gate-source voltage breakdown protection. The drain of FET Q1 is powered from a +52 volt supply coupled at terminal 66. The source of transistor Q1 is coupled to output terminal 58, which terminal is in turn coupled to driver 10. Capacitor 68 is a bootstrap capacitor providing positive feedback so that the impedance seen by the collector of Q3 (the gate input capacitance of Q1) remains high. Resistors 70 and 72 provide negative feedback to stabilize the AC and DC gain of the circuit. During that portion of the modulation cycle when no linearity correction is taking place, power supply 18 supplies power successively through input terminal 60, diode 20, and terminal 58 to driver 10. When correction is provided, diode 20 prevents current flow from transistor Q1 to supply 18. If supply 18 fails and provides no voltage, diode 74 supplies a current path from ground to bridge 10 and to PWF 40. Without diode 74, current would successively flow from terminal 66 to FET Q1, to bridge 10, to PWF 40, causing overdissipation of power in Q1.

What is claimed is:

1. An apparatus comprising an RF driver stage, an RF power amplifier stage coupled to said RF driver stage, a pulse width modulator having input means for receiving a modulating signal, a pulse width filter having an input coupled to said pulse width modulator and an output coupled to said RF driver stage and to said RF power amplifier stage, said RF power amplifier stage presenting a nonlinear load to said pulse width filter during a portion of the conduction cycle of said modulation signal, and linearity correction means having an input coupled to said pulse width filter output and an output coupled to said RF driver stage for ensuring a linear load on said pulse width filter by modulating a DC supply voltage applied to said driver stage in accordance with the modulation voltage applied to said stages during said portion of the conduction cycle of the modulation signal when a nonlinearity occurs.

2. An apparatus as claimed in claim 1 wherein said linearity correction means comprises a differential amplifier coupled to said pulse width filter, and a follower stage coupled to said differential amplifier.

3. An apparatus as claimed in claim 2 wherein said linearity correction means further comprises means coupled to said differential amplifier for adjusting the amplitude of said modulation of said DC supply voltage.

4. An apparatus as claimed in claim 2 wherein said linearity correction means further comprises means coupled to said amplifier for adjusting the portion of the modulation cycle over which said correction is effective.

5. An apparatus as claimed in claim 2 wherein said follower stage comprises means for preventing oscillation of said follower stage.

6. An apparatus as claimed in claim 2 wherein said follower stage comprises feedback means for raising the load impedance presented to said differential amplifier.

7. An apparatus as claimed in claim 2 wherein said correction means further comprises diode means for preventing excessive heat dissipation in said follower stage.

8. An apparatus as claimed in claim 1 wherein said driver and amplifier stages comprise bridge circuits.

* * * * *

UNITED STATES PATENT AND TRADEMARK OFFICE
CERTIFICATE OF CORRECTION

PATENT NO. : 4,336,615
DATED : June 22, 1982
INVENTOR(S) : Richard Frank Abt and William Louis Behrend It is certified that error appears in the above-identified patent and that said Letters Patent is hereby corrected as shown below:

IN THE CLAIMS:

Column 4, line 20, " RF power amplifier stage, said RF power amplifier" should read -- RF power amplifier stage for applying modulation voltage thereto, said RF power amplifier --

Signed and Sealed this

Thirty-first Day of August 1982

[SEAL]

Attest:

GERALD J. MOSSINGHOFF

Attesting Officer

Commissioner of Patents and Trademarks